US012670115B2

(12) United States Patent
Zuo et al.

(10) Patent No.: US 12,670,115 B2
(45) Date of Patent: Jun. 30, 2026

(54) NON-VOLATILE THREE-DIMENSIONAL MEMORY CELL, STORAGE METHOD, AND CHIP ASSEMBLY

(71) Applicant: Xi'an UniIC Semiconductors Co., Ltd., Xi'an (CN)

(72) Inventors: Fengguo Zuo, Xi'an (CN); Jun Zhou, Xi'an (CN); Bin Hou, Xi'an (CN)

(73) Assignee: Xi'an UniIC Semiconductors Co., Ltd., Xi'an (CN)

( * ) Notice: Subject to any disclaimer, the term of this patent is extended or adjusted under 35 U.S.C. 154(b) by 123 days.

(21) Appl. No.: 18/731,414

(22) Filed: Jun. 3, 2024

(65) Prior Publication Data

US 2024/0320180 A1 Sep. 26, 2024

Related U.S. Application Data

(63) Continuation of application No. PCT/CN2022/138776, filed on Dec. 13, 2022.

(30) Foreign Application Priority Data

Dec. 16, 2021 (CN) .......................... 202111544069.7

(51) Int. Cl.
*G06F 13/16* (2006.01)
*G06F 13/40* (2006.01)
(Continued)

(52) U.S. Cl.
CPC ...... *G06F 13/4068* (2013.01); *G06F 13/1668* (2013.01); *G06F 13/4221* (2013.01); (Continued)

(58) Field of Classification Search
CPC ............. G06F 13/4068; G06F 13/1668; G06F 13/4221; H10B 80/00; H01L 25/18; H01L 2225/06513; H10W 90/00
(Continued)

(56) References Cited

U.S. PATENT DOCUMENTS 5,136,700 A 8/1992 Thacker
8,698,321 B2 * 4/2014 Suh ..................... H01L 25/0657
257/E23.141
(Continued)

FOREIGN PATENT DOCUMENTS

CN 101017460 A 8/2007
CN 107766172 A 3/2018
(Continued)

OTHER PUBLICATIONS

International Search Report, International Application No. PCT/CN2022/138776, mailed Mar. 8, 2023 (12 pages).
(Continued)

*Primary Examiner* — Christopher B Shin

(57) ABSTRACT

A non-volatile three-dimensional memory cell, a storage method, and a chip assembly are provided. The non-volatile three-dimensional memory cell includes: a volatile memory chip; an interface chip, connected to the volatile memory chip in a three-dimensional stacked manner through a three-dimensional heterogeneous integrated structure; a non-volatile memory chip, connected to at least one of the volatile memory chip and the interface chip in a three-dimensional stacked manner through the three-dimensional heterogeneous integrated structure, and the non-volatile three-dimensional memory cell is formed. The interface chip includes a communication protocol circuit, the data is programed in at least one of the volatile memory chip and the non-volatile memory chip in a cache coherence manner through the communication protocol circuit. The data is read from at least one of the volatile memory chip and the non-volatile memory chip in a cache coherence manner through the communication protocol circuit.

20 Claims, 6 Drawing Sheets

(51) Int. Cl.
*G06F 13/42* (2006.01)
*H10B 80/00* (2023.01)
*H10W 90/00* (2026.01)

(52) U.S. Cl.
CPC ............. *H10B 80/00* (2023.02); *H10W 90/00* (2026.01); *H10W 90/722* (2026.01)

(58) Field of Classification Search
USPC ......................................................... 710/305
See application file for complete search history.

(56)                   References Cited

U.S. PATENT DOCUMENTS

| | | | | |
|---|---|---|---|---|
| 11,222,884 B2* | 1/2022 | Chang | ................. | H01L 25/0657 |
| 11,537,521 B2* | 12/2022 | Lim | .................... | G06F 13/1689 |
| 11,610,911 B2* | 3/2023 | Lin | .......................... | G11C 5/04 |
| 12,079,475 B1* | 9/2024 | Mathuriya | .......... | G11C 11/4093 |
| 2008/0082734 A1* | 4/2008 | Karamcheti | ........ | G06F 13/1657 |
| | | | | 711/E12.008 |
| 2017/0154148 A1 | 6/2017 | Barowski et al. | | |
| 2019/0325919 A1* | 10/2019 | Bhargava | ........... | G11C 14/0045 |
| 2020/0135719 A1* | 4/2020 | Brewer | ............... | H10D 88/101 |
| 2020/0168595 A1* | 5/2020 | Chang | ................... | H01L 23/481 |
| 2021/0248094 A1* | 8/2021 | Norman | ................ | G06F 9/4403 |
| 2023/0055349 A1* | 2/2023 | Ramesh | ................ | G06F 3/0604 |
| 2024/0394190 A1 | 11/2024 | Zhang et al. | | |

FOREIGN PATENT DOCUMENTS

| | | |
|---|---|---|
| CN | 110854116 A | 2/2020 |
| CN | 112837725 A | 5/2021 |
| CN | 113495861 A | 10/2021 |
| CN | 113626373 A | 11/2021 |
| CN | 113643739 A | 11/2021 |
| CN | 113704025 A | 11/2021 |
| CN | 113782070 A | 12/2021 |
| CN | 113793632 A | 12/2021 |
| CN | 113946290 A | 1/2022 |
| CN | 114049905 A | 2/2022 |
| CN | 216450386 U | 5/2022 |

OTHER PUBLICATIONS

Chinese First Office Action, Chinese Application No. 202111544069.7, mailed Aug. 27, 2023 (13 pages).

* cited by examiner

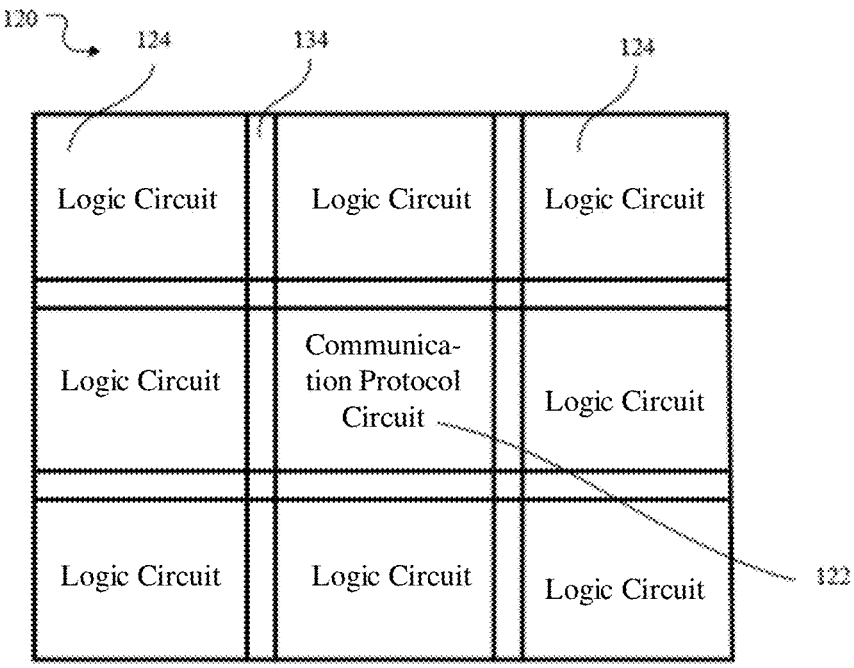
FIG. 7
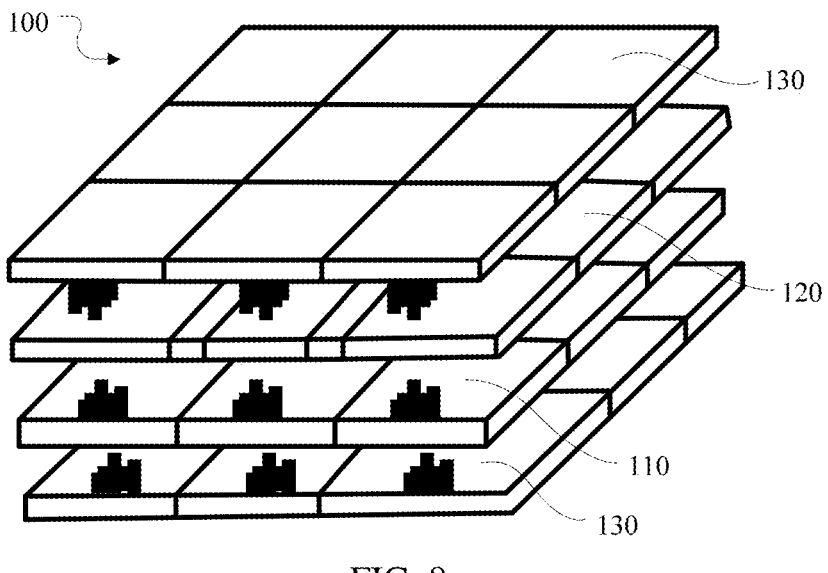
FIG. 8
receiving data from a communication protocol circuit, and storing the data from the communication protocol circuit in at least one of a first memory array and a third memory array
S102
FIG. 9 receiving data from a communication protocol circuit, and transmitting the data from the communication protocol to at least one logic circuit through a routing unit, and storing data processed by the at least one of the logic circuits in at least one of a second memory array and a fourth memory array.

S202

300

1

NON-VOLATILE THREE-DIMENSIONAL MEMORY CELL, STORAGE METHOD, AND CHIP ASSEMBLY

CROSS REFERENCE TO RELATED APPLICATIONS

The present application is a continuation of International Patent Application No. PCT/CN2022/138776, filed on Dec. 13, 2022, which claims priority of the Chinese Patent Application No. 202111544069.7, filed on Dec. 16, 2021, and both of which are herein incorporated by reference in their entireties.

TECHNICAL FIELD

The present disclosure relates to the field of data storage, and in particular to a non-volatile three-dimensional memory cell, a storage method, and a chip assembly.

BACKGROUND

In the related art, when data is stored, it is necessary to transmit the data to other components such as a main board, the data is processed through a communication protocol stored in the other components such as the main board, and then the data is programed to a memory for being stored. When the data is read from the memory, it is also necessary to transmit the data to the other components such as the main board, the data is processed through the communication protocol stored in the other components such as the main board, and then the data is transmitted outwards.

The data can be stored and read only after the data is processed by the components such as the main board, resulting in prolonging a data transmission path, increasing data transmission time, and reducing efficiency of storing and reading data.

In addition, when the memory is powered off, the data stored in the memory needs to be transmitted to a non-volatile memory chip for being stored, so as to reduce data loss, which further extends the data transmission path, reduces the efficiency of data transmission, and increasing the risk of data loss.

SUMMARY OF THE DISCLOSURE

In a first aspect, the embodiments of the present disclosure provide a non-volatile three-dimensional memory cell. The non-volatile three-dimensional memory cell includes: a volatile memory chip, configured to store data; an interface chip, connected to the volatile memory chip in a three-dimensional stacked manner through a three-dimensional heterogeneous integrated structure; a non-volatile memory chip, connected to at least one of the volatile memory chip and the interface chip in a three-dimensional stacked manner through the three-dimensional heterogeneous integrated structure, so as to form the non-volatile three-dimensional memory cell; wherein the interface chip includes a communication protocol circuit configured to store a communication protocol, the data is programed in at least one of the volatile memory chip and the non-volatile memory chip in a cache coherence manner through the communication protocol circuit; and, the data is read from at least one of the volatile memory chip and the non-volatile memory chip in a cache coherence manner through the communication protocol circuit.

In a second aspect, the embodiments of the present disclosure provide a method for storing data, which is applied in the non-volatile three-dimensional memory cell in the first aspect. The volatile memory chip includes a first memory array, a second memory array, a third memory array, and a fourth memory array the interface chip further includes a plurality of logic circuits electrically connected to each other through a routing unit, and each of the plurality of logic circuits is electrically connected to the communication protocol circuit through the routing unit. The method includes: receiving data from the communication protocol circuit, and storing the data from the communication protocol circuit in at least one of the first memory array and the third memory array; or receiving data from the communication protocol circuit, and transmitting the data from the communication protocol to at least one of the plurality of logic circuits through the routing unit, and storing data processed by the at least one of the logic circuits in at least one of the second memory array and the fourth memory array.

In a third aspect, the embodiments of the present disclosure provide a non-volatile three-dimensional memory chip assembly, including a non-volatile three-dimensional memory cell as described in the first aspect, and a substrate, electrically connected to a non-volatile three-dimensional memory cell and configured to encapsulate the non-volatile three-dimensional memory cell.

BRIEF DESCRIPTION OF THE DRAWINGS

FIG. 7 is a structural schematic view of an interface chip according to some embodiments of the present disclosure.

FIG. 8 is a structural schematic view of a three-dimensional non-volatile memory cell according to some embodiments of the present disclosure.

FIG. 9 is a flow chart of a method for storing data according to some embodiments of the present disclosure.

Figure 1:
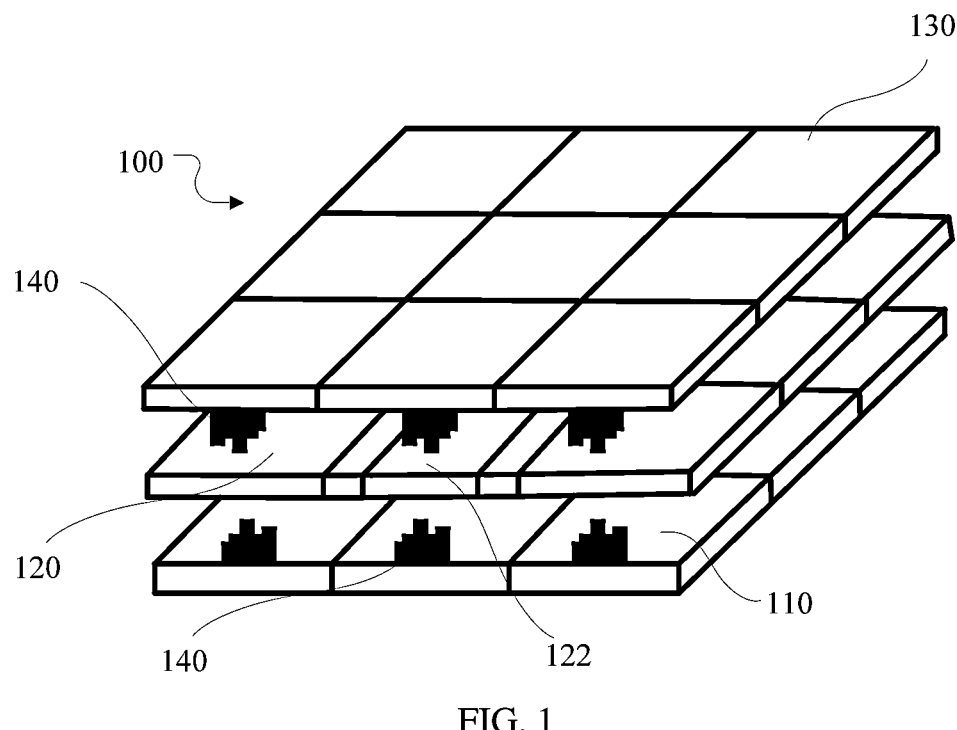
FIG. 1 is a structural schematic view of a three-dimensional non-volatile memory cell according to some embodiments of the present disclosure.

A corresponding relationship between reference numerals and component names shown in FIGS. 1-12 is as follows.

100: three-dimensional non-volatile memory cell, 110: volatile memory chip, 112: first memory array, 114:

second memory array, 116: third memory array, 118: fourth memory array, 120: interface chip, 122: communication protocol circuit, 124: logic circuit, 126: fixed logic circuit, 128: programmable logic circuit, 130: non-volatile memory chip, 131: embedded programmable logic circuit, 132: embedded multiplication circuit, 133: embedded memory cell, 134: routing unit, 140: three-dimensional heterogeneous integrated structure, 142: first three-dimensional heterogeneous integrated structure, 144: second three-dimensional heterogeneous integrated structure, 146: third three-dimensional heterogeneous integrated structure, 148: fourth three-dimensional heterogeneous integrated structure, 200: non-volatile three-dimensional memory chip assembly, 210: substrate, 212: pin, 300: electronic device, 310: processor.

DETAILED DESCRIPTION

In order to better understand the above purposes, features and advantages of the present disclosure, the present disclosure is further described in detail below in combination with the drawings and specific embodiments. It should be noted that the embodiments of the present disclosure and the features in the embodiments may be combined with each other without conflict.

Many specific details are described in the following description to facilitate full understanding of the present disclosure. However, the present disclosure may also be implemented in other ways different from those described here. Therefore, the scope of protection of the present disclosure is not limited by the specific embodiments disclosed below.

In some embodiments, when data is stored and read, the data is generally processed through a communication protocol stored in a main board. Specifically, when the data is stored, it is necessary to transmit the data to the main board, the data is processed through the communication protocol stored in the main board, and then the data is transmitted to a volatile memory chip for being stored. When the data stored in the volatile memory chip is read, it is also necessary to transmit the data to the main board, the data is processed through the communication protocol stored in the main board, and then the data is transmitted to a processor or other components, such that the data stored in the volatile memory chip may be transmitted outwards. In this way, the data may be stored and read only when the data is transmitted between the main board and the volatile memory chip, resulting in increasing a data transmission path, prolonging data transmission time, and reducing efficiency of storing and reading data.

In addition, in some embodiments, the volatile memory chip communicates with the non-volatile memory chip, such that the data in the volatile memory chip needs to be transmitted to the non-volatile memory chip to reduce data loss when the volatile memory chip is powered off. However, the data transmission is performed through the communication connection between volatile memory chip and the non-volatile memory chip, which prolongs the data transmission path, increases the data transmission time, reduces the efficiency of data transmission, and thus it may increase the risk of data loss.

In order to solve at least one of the above technical problems, in a first aspect, as shown in FIG. 1, the embodiments of the present disclosure provide a non-volatile three-dimensional memory cell 100. The non-volatile three-dimensional memory cell 100 includes a volatile memory chip 110, an interface chip 120, and a non-volatile memory chip 130. The volatile memory chip 110 is configured to store data. The interface chip 120 is connected to the volatile memory chip 110 in a three-dimensional stacked manner through a three-dimensional heterogeneous integrated structure 140. The non-volatile memory chip 130 is connected to at least one of the volatile memory chip 110 and the interface chip 120 in the three-dimensional stacked manner through the three-dimensional heterogeneous integrated structure 140, such that the non-volatile three-dimensional memory cell 100 is formed. The interface chip 120 includes a communication protocol circuit 122 configured to store a communication protocol. The data is programed in at least one of the volatile memory chip 110 and the non-volatile memory chip 130 in a cache coherence manner through the communication protocol circuit 122, and the data is read from at least one of the volatile memory chip 110 and the non-volatile memory chip 130 in the cache coherence manner through the communication protocol circuit 122.

It may be understood that both the volatile memory chip 110 and the non-volatile memory chip 130 are configured to store the data. When the non-volatile three-dimensional memory cell 100 is powered off, the data stored in the volatile memory chip 110 is lost, while the data stored in the non-volatile memory chip 130 may be saved/stored.

In some embodiments, a storage capacity of the volatile memory chip 110 may be the same as or different from that of the non-volatile memory chip 130. In some embodiments, the storage capacity of the non-volatile memory chip 130 is greater than that of the volatile memory chip 110, such that it may be possible to ensure that the data in the volatile memory chip 110 may be programed in the non-volatile memory chip 130, thereby improving the reliability of the non-volatile three-dimensional memory cell 100.

In some embodiments, the volatile memory chip 110 may be a Dynamic Random Access Memory (DRAM). The non-volatile memory chip 130 may be a Programmable Read Only Memory (PROM), an Electrically Erasable Programmable Read Only Memory (EEPROM), an Erasable Programmable Read Only Memory (EPROM), and so on.

It may be understood that the interface chip 120 is configured to receive the data. The interface chip 120 is connected to the volatile memory chip 110 in a three-dimensional stacked manner through the three-dimensional heterogeneous integrated structure 140, such that the interface chip 120 may be capable of transmitting received data to the volatile memory chip 110 for being stored. Similarly, the data stored in the volatile memory chip 110 may also be read by the interface chip 120 through the three-dimensional heterogeneous integrated structure 140, and the data may be transmitted outside the non-volatile three-dimensional memory cell 100 through the interface chip 120. In some embodiments, a material of the interface chip 120 is silicon, and a semiconductor component may be integrated on the interface chip 120.

The non-volatile memory chip 130 is connected to at least one of the volatile memory chip 110 and the interface chip 120 in the three-dimensional stacked manner through the three-dimensional heterojunction structure 140. It may be understood that when the non-volatile memory chip 130 is connected to the volatile memory chip 110 in the three-dimensional stacked manner through the three-dimensional heterojunction structure 140, the data stored in the volatile memory chip 110 may be programed in the non-volatile memory chip 130 through the three-dimensional heterogeneous integrated structure 140. Similarly, the data stored in the non-volatile memory chip 130 may also be transmitted to the volatile memory chip 110 through the three-dimensional heterogeneous integrated structure 140.

When the non-volatile memory chip 130 is connected to the interface chip 120 in the three-dimensional stacked manner through the three-dimensional heterogeneous integrated structure 140, the data received by the interface chip 120 may be programed in the non-volatile memory chip 130 through the three-dimensional heterojunction structure 140. Similarly, data stored in the non-volatile memory chip 130 may also be transmitted to the interface chip 120 through the three-dimensional heterogeneous integrated structure 140.

It may be understood that the three-dimensional heterogeneous integrated structure 140 is capable of directly interconnecting metal layers in two different chips (such as the interface chip 120 and the volatile memory chip 110) across the two different chips, and establishing a high-density metal layer interconnection within the chips layer by layer, thus it is not necessary to arrange an input/output interface (an IO interface) or an input/output circuit (an IO circuit). In this way, it may enable the data to be transmitted between the two different chips, thereby shortening the data transmission path and improving the efficiency of data transmission.

In some embodiments, the three-dimensional heterogeneous integrated structure 140 may be formed in a hybrid bonding manner, so as to enable the data to be transmitted between the volatile memory chip 110, the interface chip 120, and the non-volatile memory chip 130.

It may be seen that through the above arrangement, the data is transmitted between the volatile memory chip 110, the interface chip 120, and the non-volatile memory chip 130 through the three-dimensional heterogeneous integrated structure 140, thereby greatly increasing a data processing bandwidth of the non-volatile three-dimensional memory cell 100, reducing the power consumption of the non-volatile three-dimensional memory cell 100, reducing the access conflict, and improving the performance of the non-volatile three-dimensional memory cell 100. In addition, through the above arrangement, an occupied area of the non-volatile three-dimensional memory cell 100 may be reduced, and the usage flexibility of the non-volatile three-dimensional memory cell 100 may be improved.

Moreover, the data is programed in the non-volatile memory chip 130 through the three-dimensional heterogeneous integrated structure 140, such that it may shorten the transmission path when the data is programed in the non-volatile memory chip 130, thereby further improving the storage reliability of the data, reducing the risk of data loss, and improving the usage reliability of the non-volatile three-dimensional memory cell 100.

As shown in FIG. 1, the interface chip 120 includes a communication protocol circuit 122 configured to store the communication protocol. In some embodiments, the communication protocol circuit 122 may be arranged on the interface chip 120 by means of etching.

It may be understood that the communication protocol circuit 122 is capable of processing the data according to the stored communication protocol. After the data is processed by the communication protocol circuit 122, the data may be programed in at least one of the volatile memory chip 110 and the non-volatile memory chip 130 in a cache coherence manner, and may be read from the at least one of the volatile memory chip 110 and the non-volatile memory chip 130.

It may be understood that the data is programed in at least one of the volatile memory chip 110 and the non-volatile memory chip 130 in the cache coherence manner, and may be read from the at least one of the volatile memory chip 110 and the non-volatile memory chip 130 in the cache coherence manner, which refers to an ability to maintain link consistency between the communication protocol circuit 122 and the volatile memory chip 110, and maintain link consistency between the communication protocol circuit 122 and the non-volatile memory chip 130. In this way, the data may be stored and read in the communication protocol circuit 122 and the volatile memory chip 110 without being processed by other components (such as the main board), and the data may further be stored and read between the communication protocol circuit 122 and the non-volatile memory chip 130, thereby shortening the data transmission path and improving the efficiency of storing and reading the data.

It may be understood that link consistency may also be maintained between the volatile memory chip 110 and the non-volatile memory chip 130. In this way, when the non-volatile memory chip 130 is connected to the volatile memory chip 110 in the three-dimensional stacked manner through the three-dimensional heterogeneous integrated structure 140, the data processed by the communication protocol circuit 122 may be stored and read between the volatile memory chip 110 and the non-volatile memory chip 130, thereby further improving the efficiency of processing data of the non-volatile three-dimensional memory cell 100, reducing data loss, and ensuring storage reliability of the data.

From the above, it may be seen that the communication protocol circuit 122 is arranged on the interface chip 120, such that the data may be programed in the at least one of the volatile memory chip 110 and the non-volatile memory chip 130 in the cache coherence manner, and the data may be read from the at least one of the volatile memory chip 110 and the non-volatile memory chip 130 in the cache coherence manner. In this way, the data may be stored and read in a case where it is not necessary to transmit the data to the other components (such as the main board), thereby shortening the data transmission path, reducing the data transmission time, reducing data storage and reading process latency, and improving the efficiency of storing and reading data of the non-volatile three-dimensional memory cell 100, and thus the performance of the non-volatile three-dimensional memory cell 100 may be improved.

In some embodiments, the number of communication protocol circuits 122 may be one or more. Communication protocols stored in different communication protocol circuits 122 may be the same as or different from each other. In some embodiments, a plurality of communication protocols may be stored in one communication protocol circuit 122.

Figure 2:
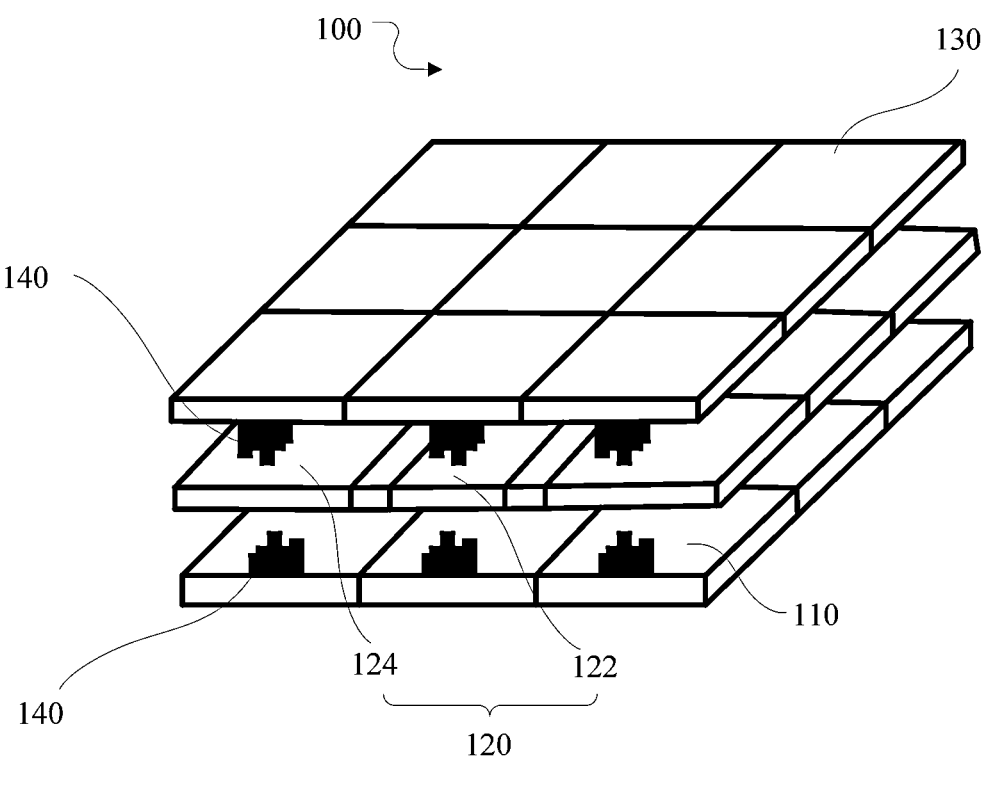
FIG. 2 is a structural schematic view of a three-dimensional non-volatile memory cell according to some embodiments of the present disclosure.

In some embodiments, as shown in FIG. 2, the interface chip 120 further includes a logic circuit 124. The logic circuit 124 is electrically connected to the communication protocol circuit 122. The data is programed in the at least one of the volatile memory chip 110 and the non-volatile memory chip 130 in the cache coherence manner through the communication protocol circuit 122 and the logic circuit 124, and the data is read from the at least one of the volatile memory chip 110 and the non-volatile memory chip 130 in the cache coherence manner through the communication protocol circuit 122 and the logic circuit 124.

It may be understood that the logic circuit 124 stores computational logic, such that the logic circuit 124 is capable of performing logical calculation on the data. In some embodiments, the logic circuit 124 may be an analog-to-digital conversion circuit, a comparison circuit, an amplification circuit, or the like. In some embodiments, the logic circuit 124 may be arranged on interface chip 120 by means of etching. In some embodiments, the number of logic circuits 124 may be more than one, and computational logic stored in different logic circuits 124 may be the same as or different from each other.

It may be understood that the communication protocol circuit 122 is electrically connected to the logic circuit 124, such that the data may be transmitted between the communication protocol circuit 122 and the logic circuit 124. In some embodiments, the communication protocol circuit 122 may be electrically connected to the logic circuit 124 through a copper wire.

In some embodiments, when the data is stored, the communication protocol circuit 122 may transmit the processed data to the logic circuit 124, the logic circuit 124 performs the logical calculation processing on the data, and then the data is programed in the at least one of the volatile memory chip 110 and the non-volatile memory chip 130. When the data is read, the data in the at least one of the volatile memory chip 110 and the non-volatile memory chip 130 may be transmitted to the logic circuit 124, the logic circuit 124 performs the logical calculation processing on the data and transmits the data to the communication protocol circuit 122, and the communication protocol circuit 122 transmits the processed data outside the non-volatile three-dimensional memory cell 100.

From the above, it may be seen that the logic circuit 124 is electrically connected to the communication protocol circuit 122, such that the data may be transmitted between the communication protocol circuit 122 and the logic circuit 124. Therefore, not only the data may be stored and read in the cache coherence manner through the communication protocol circuit 122, but also logical calculation of the data may be achieved through the logic circuit 124. In this way, when the data is stored and read, the logical calculation of the data may be achieved in a case where it is not necessary to transmit the data to the other components (such as a programmable memory controller, etc.), thereby further shortening the data transmission path, reducing the data transmission time, and improving the data processing efficiency of the non-volatile three-dimensional memory cell 100. In addition, it may also enable the non-volatile three-dimensional memory cell 100 to achieve a logical processing function for the data, thereby further improving the performance of the non-volatile three-dimensional memory cell 100.

In some embodiments, the communication protocol circuit 122 and the logic circuit 124 may be arranged on different areas of the interface chip 120. In some embodiments, communication protocol circuit 122 and logic circuit 124 may be arranged on a same area of the interface chip 120.

Figure 3:
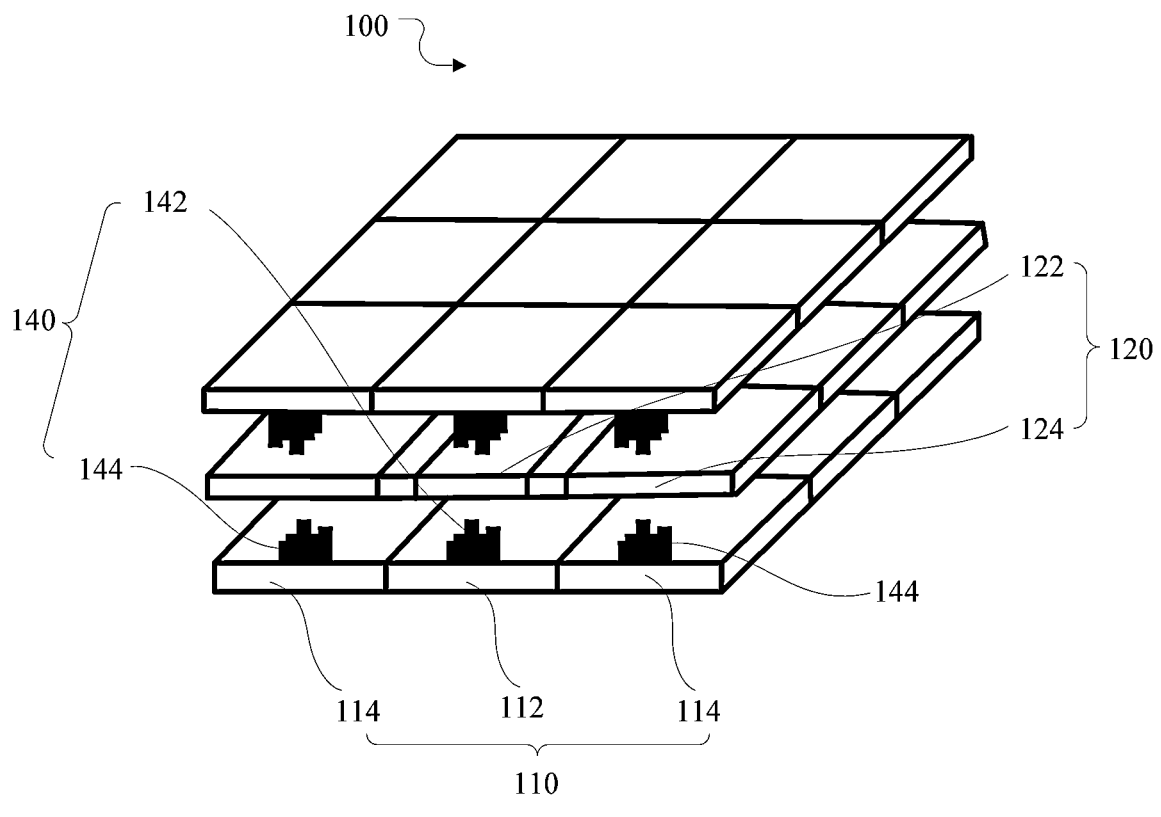
FIG. 3 is a structural schematic view of a three-dimensional non-volatile memory cell according to some embodiments of the present disclosure.

In some embodiments, as shown in FIG. 3, the volatile memory chip 110 includes a first memory array 112 and a second memory array 114. The communication protocol circuit 122 is electrically connected to the first memory array 112 through a first three-dimensional heterogeneous integrated structure 142. The logic circuit 124 is electrically connected to the second memory array 114 through a second three-dimensional heterojunction structure 144. An orthographic projection of the communication protocol circuit 122 falls within a range of orthographic projection of the first memory array 112, and an orthographic projection of the logic circuit 124 falls within a range of orthographic projection of the second memory array 114.

It may be understood that the number of first memory arrays 112 may be more than one, and the number of second memory arrays 114 may be more than one. A shape and an area of the first memory array 112 may be the same as or different from a shape and an area of the second memory array 114. The first memory array 112 and the second memory array 114 in the embodiments of the present disclosure are only used to distinguish two different storage areas of the volatile memory chip 110, but not further limit the first memory array 112 and the second memory array 114.

The communication protocol circuit 122 is electrically connected to the first memory array 112 through the first three-dimensional heterojunction structure 142, such that the data processed by the communication protocol circuit 122 may be transmitted to the first memory array 112 for being stored through the first three-dimensional heterojunction structure 142. Similarly, the data stored in the first memory array 112 may also be transmitted to the communication protocol circuit 122 through the first three-dimensional heterogeneous integrated structure 142.

The logic circuit 124 is electrically connected to the second memory array 114 through the second three-dimensional heterojunction structure 144, such that the data processed by the logic circuit 124 may be transmitted to the second memory array 114 through the second three-dimensional heterojunction structure 144. Similarly, the data stored in the second memory array 114 may also be transmitted to the logic circuit 124 through the second three-dimensional heterogeneous integrated structure 144.

It may be understood that the first three-dimensional heterojunction structure 142 may be the same as or different from the second three-dimensional heterojunction structure 144. The first three-dimensional heterogeneous integrated structure 142 and the second three-dimensional heterogeneous integrated structure 144 in the embodiments of the present disclosure are only used to distinguish a three-dimensional heterogeneous integrated structure 140 arranged between the communication protocol circuit 122 and the first memory array 112, and a three-dimensional heterogeneous integrated structure 140 arranged between the logic circuit 124 and the second memory array 114, but not further limit the first three-dimensional heterojunction integrated structure 142 and the second three-dimensional heterojunction integrated structure 144.

From the above, it may be seen that the logic circuit 124 is electrically connected to the communication protocol circuit 122, such that when the data is stored in the volatile memory chip 110, the data may be directly transmitted to the first memory array 112 for being stored through the first three-dimensional heterogeneous integrated structure 142 if it is not necessary to perform the logical calculation on the data processed by the communication protocol circuit 122. If it is necessary to perform the logical calculation on the data processed by the communication protocol circuit 122, the data processed by the communication protocol circuit 122 may be transmitted to the logic circuit 124. After the logic circuit 124 performs the logical calculation on the data, the processed data is transmitted to the second memory array 114 for being stored through the second three-dimensional heterogeneous integrated structure 144.

Similarly, when the data in the volatile memory chip 110 is read, if it is not necessary to perform the logical calculation on the data, the data may be transmitted to the communication protocol circuit 122 through the first three-dimensional heterogeneous integrated structure 142, and then the data is transmitted outside the non-volatile three-dimensional memory cell 100 after the data is processed by the communication protocol circuit 122. If it is necessary to perform the logical calculation on the data, the data may be transmitted to the logic circuit 124 through the second three-dimensional heterogeneous integrated structure 144, the logic circuit 124 performs the logical calculation processing on the data, the data is transmitted to the communication protocol circuit 122, and the data is transmitted outside the non-volatile three-dimensional memory cell 100 after the data is processed by the communication protocol circuit 122.

From the above, it may be seen that the communication protocol circuit 122 is electrically connected to the first memory array 112 through the first three-dimensional heterogeneous integration structure 142, and the logic circuit 124 is electrically connected to the second memory array 114 through the second three-dimensional heterogeneous integration structure 144, such that the data may be directly stored after the data is processed by the communication protocol circuit 122, or the data may also be stored after the data is processed by the communication protocol circuit 122 and the logic circuit 124, thereby meeting the processing needs of different data and improving the usage flexibility of the non-volatile three-dimensional memory cell 100.

Moreover, through the above arrangement, data processed by different means (i.e., data processed by the logical calculation and data without the logical calculation) may be transmitted through different three-dimensional heterojunction structures 140 (i.e., the first three-dimensional heterojunction structure 142 and the second three-dimensional heterojunction structure 144). In addition, the data processed by different means may be stored in different memory arrays (i.e., the first memory array 112 and the second memory array 114), thereby reducing crosstalk during a process of transmitting and storing the data, and thus the usage reliability of the non-volatile three-dimensional memory cell 100 may be improved.

In addition, the orthographic projection of the communication protocol circuit 122 falls within the range of the orthographic projection of the first memory array 112, that is, a disposing position of the communication protocol circuit 122 corresponds to a disposing position of the first memory array 112. The orthographic projection of the logic circuit 124 falls within the range of the orthographic projection of the second memory array 114, that is, a disposing position of the logic circuit 124 corresponds to a disposing position of the second memory array 114. Through the above arrangement, a distance between the communication protocol circuit 122 and the first memory array 112 may be reduced, and a distance between the logic circuit 124 and the second memory array 114 may be reduced, thereby further shortening the data transmission path, reducing the data transmission time, and improving the efficiency of storing and reading the data.

Figure 4:
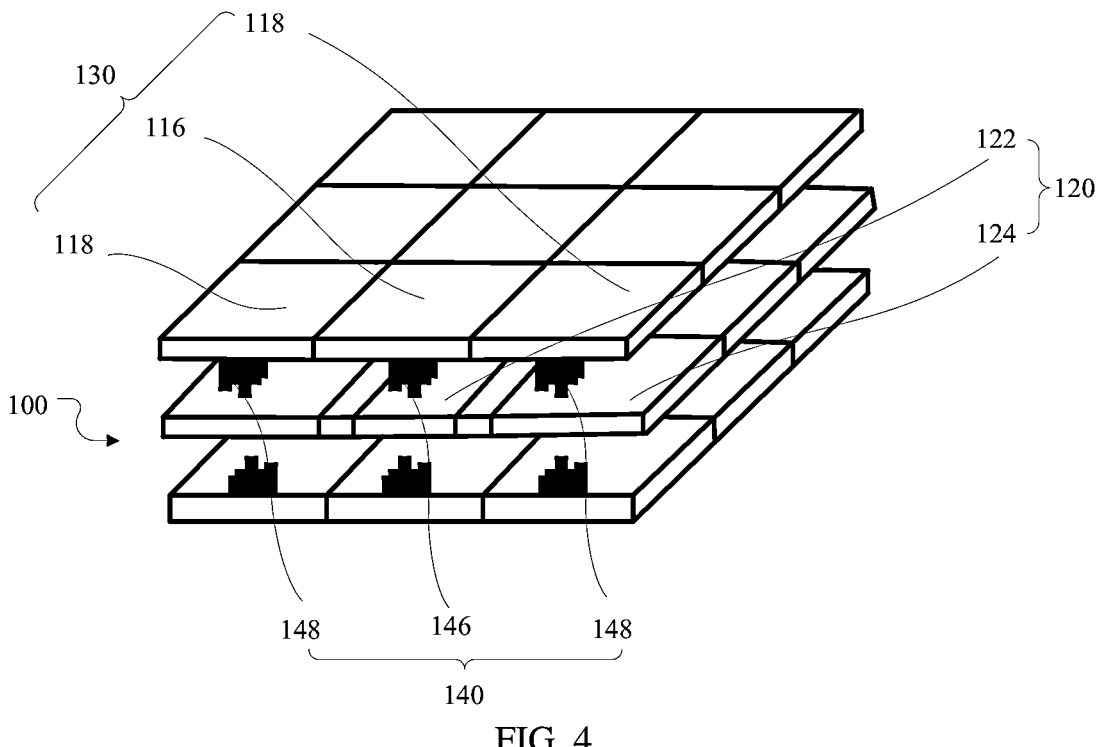
FIG. 4 is a structural schematic view of a three-dimensional non-volatile memory cell according to some embodiments of the present disclosure.

In some embodiments, as shown in FIG. 4, the non-volatile memory chip 130 is connected to the interface chip 120 in the three-dimensional stacked manner through the three-dimensional heterogeneous integrated structure 140. The non-volatile memory chip 130 includes a third memory array 116 and a fourth memory array 118. The communication protocol circuit 122 is electrically connected to the third memory array 116 through a third three-dimensional heterogeneous integrated structure 146. The logic circuit 124 is electrically connected to the fourth memory array 118 through a fourth three-dimensional heterogeneous integrated structure 148. The orthographic projection of the communication protocol circuit 122 falls within a range of an orthographic projection of the third memory array 116, and the orthographic projection of the logic circuit 124 falls within a range of an orthographic projection of the fourth memory array 118.

It may be understood that the number of third memory arrays 116 may be more than one, and the number of fourth memory arrays 118 may be more than one. A shape and an area of the third memory array 116 may be the same as or different from a shape and an area of the fourth memory array 118. The third memory array 116 and the fourth memory array 118 in the embodiments of the present disclosure are only used to distinguish two different storage areas of the non-volatile memory chip 130, but not further limit the third memory array 116 and the fourth memory array 118.

As shown in FIG. 4, when the non-volatile memory chip 130 is connected to the interface chip 120 in the three-dimensional stacked manner through the three-dimensional heterogeneous integrated structure 140, the communication protocol circuit 122 is electrically connected to the third memory array 116 through the third three-dimensional heterojunction structure 146, such that the data processed by the communication protocol circuit 122 may be transmitted to the third memory array 116 for being stored through the third three-dimensional heterojunction structure 146. Similarly, the data stored in the third memory array 116 may also be transmitted to the communication protocol circuit 122 through the third three-dimensional heterogeneous integrated structure 146.

The logic circuit 124 is electrically connected to the fourth memory array 118 through the fourth three-dimensional heterojunction structure 148, such that the data processed by the logic circuit 124 may be transmitted to the fourth memory array 118 through the fourth three-dimensional heterojunction structure 148. Similarly, the data stored in the fourth memory array 118 may also be transmitted to the logic circuit 124 through the fourth three-dimensional heterojunction structure 148.

It may be understood that the third three-dimensional heterojunction structure 146 may be the same as or different from the fourth three-dimensional heterojunction structure 148. The third three-dimensional heterogeneous integrated structure 146 and the fourth three-dimensional heterogeneous integrated structure 148 in the embodiments of the present disclosure are only used to distinguish a three-dimensional heterogeneous integrated structure 140 arranged between the communication protocol circuit 122 and the third memory array 116, and a three-dimensional heterogeneous integrated structure 140 arranged between the logic circuit 124 and the fourth memory array 118, but not further limit the third three-dimensional heterojunction integrated structure 146 and the fourth three-dimensional heterojunction integrated structure 148.

From the above, it may be seen that the logic circuit 124 is electrically connected to the communication protocol circuit 122, such that when the data is stored in the non-volatile memory chip 130, the data may be directly transmitted to the third memory array 116 for being stored through the third three-dimensional heterogeneous integrated structure 146 if it is not necessary to perform the logical calculation on the data processed by the communication protocol circuit 122. If it is necessary to perform the logical calculation on the data processed by the communication protocol circuit 122, the data processed by the communication protocol circuit 122 may be transmitted to the logic circuit 124. After the logic circuit 124 performs the logical calculation on the data, the processed data is transmitted to the fourth memory array 118 for being stored through the fourth three-dimensional heterogeneous integrated structure 148.

Similarly, when the data in the non-volatile memory chip 130 is read, if it is not necessary to perform the logical calculation on the data, the data may be transmitted to the communication protocol circuit 122 through the third three-dimensional heterogeneous integrated structure 146, and the data may be transmitted outside the non-volatile three-dimensional memory cell 100 after the data is processed by the communication protocol circuit 122. If it is necessary to perform the logical calculation on the data, the data may be transmitted to the logic circuit 124 through the fourth three-dimensional heterogeneous integrated structure 148, the logic circuit 124 performs the logical calculation processing on the data, the data is transmitted to the communication protocol circuit 122, and the data is transmitted outside the non-volatile three-dimensional memory cell 100 after the data is processed by the communication protocol circuit 122.

From the above, it may be seen that the communication protocol circuit 122 is electrically connected to the third memory array 116 through the third three-dimensional heterojunction structure 146, and the logic circuit 124 is electrically connected to the fourth memory array 118 through the fourth three-dimensional heterojunction structure 148, such that the data may be directly stored after the data is processed by the communication protocol circuit 122, or the data may also be stored after the data is processed by the communication protocol circuit 122 and the logic circuit 124, thereby meeting the processing needs of different data and improving the usage flexibility of the non-volatile three-dimensional memory cell 100.

Moreover, through the above arrangement, the data processed by different means (i.e., data processed by the logical calculation and data without the logical calculation) may be transmitted through different three-dimensional heterojunction structures 140 (the third three-dimensional heterojunction structure 146 and the fourth three-dimensional heterojunction structure 148). In addition, the data processed by different means may be stored in different memory arrays (i.e., the third memory array 116 and the fourth memory array 118), thereby reducing crosstalk during a process of transmitting and storing the data, and thus the usage reliability of the non-volatile three-dimensional memory cell 100 may be improved.

In addition, the orthographic projection of the communication protocol circuit 122 falls within the range of the orthographic projection of the third memory array 116, that is, a disposing position of the communication protocol circuit 122 corresponds to a disposing position of the third memory array 116. The orthographic projection of the logic circuit 124 falls within the range of the orthographic projection of the fourth memory array 118, that is, a disposing position of the logic circuit 124 corresponds to a disposing position of the fourth memory array 118. Through the above arrangement, a distance between the communication protocol circuit 122 and the third memory array 116 may be reduced, and a distance between the logic circuit 124 and the fourth memory array 118 may be reduced, thereby further shortening the data transmission path, reducing the data transmission time, and improving the efficiency of storing and reading the data.

In some embodiments, as shown in FIG. 4, the orthographic projection of the communication protocol circuit 122 falls within the range of the orthographic projection of the first memory array 112 and the range of the orthographic projection of the third memory array 116, and the orthographic projection of the logic circuit 124 falls within the range of the orthographic projection of the second memory array 114 and the range of the orthographic projection of the fourth memory array 118, thereby further shortening the data transmission path and improving the efficiency of data transmission.

Figure 5:
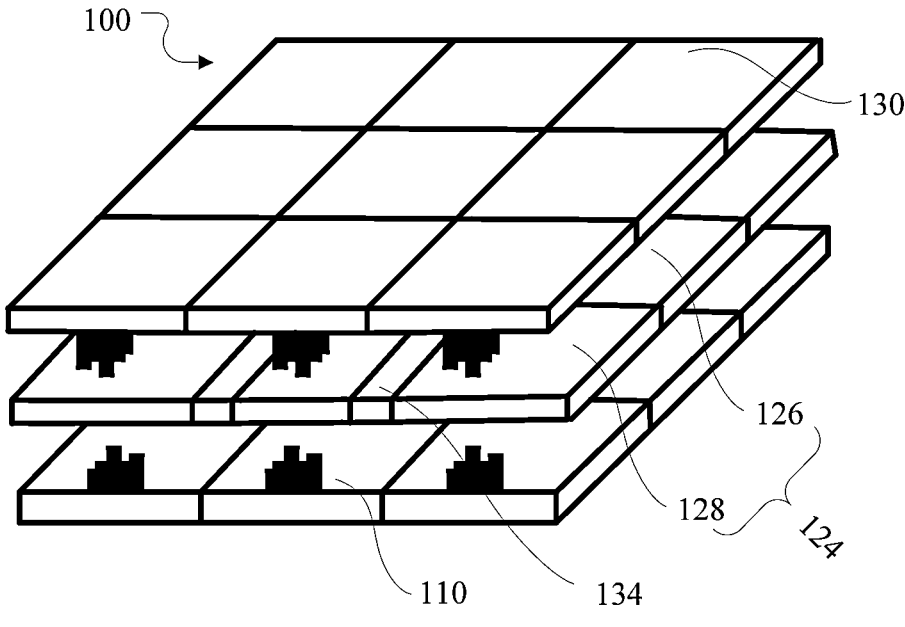
FIG. 5 is a structural schematic view of a three-dimensional non-volatile memory cell according to some embodiments of the present disclosure.

In some embodiments, as shown in FIG. 5, the logic circuit 124 includes at least one of a fixed logic circuit 126 and a programmable logic circuit 128.

It may be understood that the fixed logic circuit 126 stores fixed computational logic, and the programmable logic circuit 128 stores programmable computational logic. The logic circuit 124 includes at least one of the fixed logic circuit 126 and the programmable logic circuit 128, it may be possible to arrange different logic circuits 124 to process data according to different processing needs, thereby improving the applicability of the non-volatile three-dimensional memory cell 100.

In some embodiments, when the logic circuit 124 includes a fixed logic circuit 126 and a programmable logic circuit 128, and the fixed logic circuit 124 may be electrically connected to the programmable logic circuit 128, such that the data may be transmitted between the fixed logic circuit 124 and the programmable logic circuit 128, thereby further improving the usage flexibility of the non-volatile three-dimensional memory cell 100.

Figure 6:
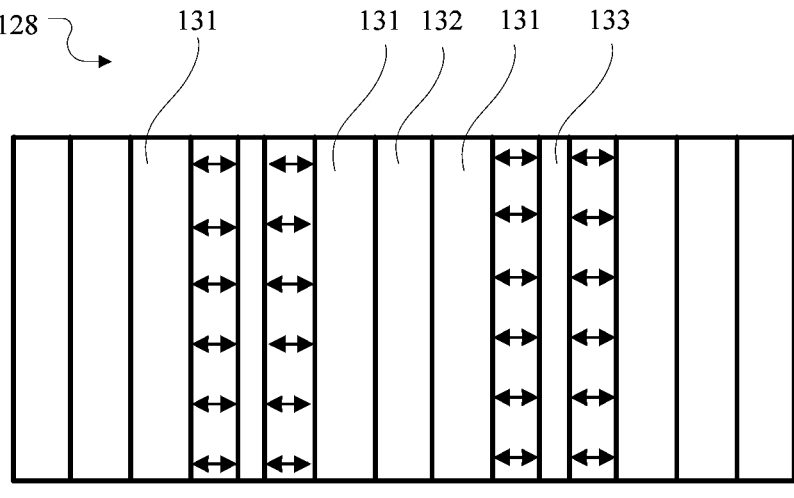
FIG. 6 is a structural schematic view of a programmable logic circuit according to some embodiments of the present disclosure.

In some embodiments, as shown in FIG. 6, the programmable logic circuit 128 includes an embedded programmable logic circuit 131, an embedded multiplication circuit 132, and an embedded memory cell 133. The embedded programmable logic circuit 131 is electrically connected to at least one of the volatile memory chip 110 and the non-volatile memory chip 130, such that the programmable logic circuit 128 may be capable of performing data transmission between the programmable logic circuit 128 and the at least one of the volatile memory chip 110 and the non-volatile memory chip 130. The embedded memory cell 133 may be electrically connected to the embedded programmable logic circuit 131 through routing, etc. The embedded multiplication circuit 132 may be electrically connected to the embedded programmable logic circuit 131 through an interface, etc.

By arranging the embedded programmable logic circuit 131, the embedded multiplication circuit 132, and the embedded memory cell 133, the computational logic of the programmable logic circuit 128 may be modified, thereby improving the applicability of the non-volatile three-dimensional memory cell 100.

In some embodiments, as shown in FIG. 7, the number of logic circuits 124 is more than one, and the plurality of logic circuits 124 are arranged around the communication protocol circuit 122.

it may be understood that, the plurality of logic circuits 124 are configured to store different calculation logic. In some embodiments, each of the plurality of logic circuits 124 may be electrically connected to the communication protocol circuit 122, such that any one of the plurality of logic circuits 124 may transmit the data between any one of the plurality of logic circuits 124 and the communication protocol circuit 122. In some embodiments, the plurality of logic circuits 124 include at least one connection logic circuit electrically connected to the communication protocol circuit 122, and remaining logic circuits 124 are electrically connected to the connection logic circuit, such that the plurality of logic circuits 124 may realize data transmission between the plurality of logic circuits 124 and the communication protocol circuit 122 through the connection logic circuit.

The number of logic circuits 124 are arranged to be more than one, and the plurality of logic circuits 124 are arranged around the communication protocol circuit 122, such that the distance between the logic circuit 124 and the communication protocol circuit 122 is further reduced, thereby shortening the data transmission path and further improving the efficiency of processing data of the non-volatile three-dimensional memory cell 100.

In some embodiments, as shown in FIG. 7, the non-volatile three-dimensional memory cell 100 further includes a routing unit 134. An orthographic projection of the routing unit 134 falls within the range of the orthographic projection of the volatile memory chip 110, and the orthographic projection of the routing unit 134 falls within the range of the orthographic projection of the non-volatile memory chip 130. the plurality of logic circuits 124 are electrically connected to each other through the routing unit 134, and each of the plurality of logic circuits 124 is electrically connected to the communication protocol circuit 122 through the routing unit 134.

It may be understood that the routing unit 134 may be a network on chip (NOC) routing unit, and the data may be transmitted on the routing unit 134.

In some embodiments, as shown in FIG. 5, the orthographic projection of the routing unit 134 falls within the range of the orthographic projection of the volatile memory chip 110 and the range of the orthographic projection of the non-volatile memory chip 130, that is, the disposing position of the routing unit 134 corresponds to the disposing position of the volatile memory chip 110 and the disposing position of the non-volatile memory chip 130.

From the above, it may be seen that the disposing position of the communication protocol circuit 122 corresponds to the disposing position of the first memory array 112 and the disposing position of the third memory array 116, that is, the disposing position of the communication protocol circuit 122 corresponds to the disposing position of the volatile memory chip 110 and the disposing position of the non-volatile memory chip 130. A disposing position of the logic circuit 124 corresponds to the disposing position of the second memory array 114 and the disposing position of the fourth memory array 118, that is, the disposing position of the logic circuit 124 corresponds to the disposing position of volatile memory chip 110 and the disposing position of non-volatile memory chip 130. Therefore, the disposing position of the routing unit 134 corresponds to the disposing position of the volatile memory chip 110 and the disposing position of the non-volatile memory chip 130, such that it may shorten a data transmission distance between the communication protocol circuit 122 and the logic circuit 124, thereby further shortening the data transmission path between the communication protocol circuit 122 and the logic circuit 124, and improving the efficiency of data transmission.

In some embodiments, the routing unit 134 is arranged between the communication protocol circuit 122 and the plurality of logic circuits 124.

In some embodiments, as shown in FIG. 7, the plurality of logic circuits 124 are electrically connected to each other through the routing unit 134, and each of the plurality of logic circuits 124 is electrically connected to the communication protocol circuit 122 through the routing unit 134, such that data may be transmitted not only between the communication protocol circuit 122 and the logic circuit 124, but also between the plurality of logic circuits 124.

In some embodiments, the data processed by the communication protocol circuit 122 is transmitted to the routing unit 134, and then transmitted to one of the plurality of logic circuits 124 through the routing unit 134. After the data is processed by the one of the plurality of logic circuits 124, the data is programed in the volatile memory chip 110 and the non-volatile memory chip 130 for being stored.

In some embodiments, the data processed by the communication protocol circuit 122 is transmitted to the routing unit 134, and is transmitted to one of the plurality of logic circuits 124 through the routing unit 134. After the data is processed by one of the plurality of logic circuits 124, the data is transmitted to the routing unit 134 again, and is transmitted to another one of the plurality of logic circuits 124 or the plurality of logic circuits 124 through the routing unit 134. After the data is processed by another one of the plurality of logic circuits 124 or the plurality of logic circuits 124, the data is programed in the volatile memory chip 110 and the non-volatile memory chip 130 for being stored.

From the above, it may be seen that the plurality of logic circuits 124 are arranged to be electrically connected to each other through the routing unit 134, and each of the plurality of logic circuits 124 is arranged to be electrically connected to the communication protocol circuit 122 through the routing unit 134, such that the data processed by the communication protocol circuit 122 may be received and processed by one of the plurality of logic circuits 124 or the plurality of different logic circuits 124, thereby realizing different logic calculation processing for the data, meeting different data processing needs, and further enhancing the applicability of the non-volatile three-dimensional memory cell 100.

Moreover, through the above arrangement, the data transmission path may be further shortened, and the efficiency of processing data of the non-volatile three-dimensional memory cell 100 may be improved.

In some embodiments, the non-volatile three-dimensional memory cell 100 further includes a memory control circuit and a non-volatile memory control circuit. The memory control circuit is arranged on the volatile memory chip 110, and/or the memory control circuit is arranged on the interface chip 120. The non-volatile memory control circuit is arranged on the non-volatile memory chip 130, and/or the non-volatile memory control circuit is arranged on the interface chip 120.

In some embodiments, the number of memory control circuits may be one or more, and the number of non-volatile memory control circuits may be one or more, so as to improve the efficiency of storing and reading data. In some embodiments, the memory control circuit and the non-volatile memory control circuit may be memory controllers (MCs). It may be understood that the number of non-volatile memory control circuits may be the same as or different from the number of memory control circuits.

By arranging the memory control circuit on the volatile memory chip 110 and/or the interface chip 120, that is, the memory control circuit is arranged on at least one of the volatile memory chip 110 and the interface chip 120, such that it may meet different usage requirements and improve the flexibility of the non-volatile three-dimensional memory cell 100.

Moreover, by arranging the non-volatile memory control circuit on the non-volatile memory chip 130 and/or the interface chip 120, that is, the non-volatile memory control circuit is arranged on at least one of the non-volatile memory chip 130 and the interface chip 120, such that it may meet different usage requirements and further improve the flexibility of the non-volatile three-dimensional memory cell 100.

In some embodiments, the memory control circuit may be arranged on the volatile memory chip 110 and/or interface chip 120 by means of etching. The non-volatile memory control circuit may also be arranged on the non-volatile memory chip 130 and/or interface chip 120 by means of etching.

In some embodiments, the number of memory control circuits is greater than or equal to a sum of the number of communication protocol circuits 122 and the number of logic circuits 124. The number of non-volatile memory control circuits is greater than or equal to a sum of the number of communication protocol circuits 122 and the number of logic circuits 124.

The number of memory control circuits is arranged to be greater than or equal to the sum of the number of communication protocol circuits 122 and the number of logic circuits 124, such that when the data is stored, it may be possible to ensure that the data in the communication protocol circuit 122 and the data in the a plurality of different logic circuits 124 may be timely programed in the volatile memory chip 110 in time through the memory control circuit. In this way, it may be possible to reduce data accumulation in the communication protocol circuit 122 or the logic circuit 124, thereby improving the usage reliability of the non-volatile three-dimensional memory cell 100.

Similarly, when the data is read, the memory control circuit may transmit the data to the communication protocol circuit 122 or the a plurality of different logic circuits 124 in time, so as to reduce a case where the amount of data in the communication protocol circuit 122 or the amount of data in the logic circuit 124 is too small, which may cause the communication protocol circuit 122 or the logic circuit 124 to be idle and affect the efficiency of processing data of the non-volatile three-dimensional memory cell 100, thereby ensuring the usage reliability of the non-volatile three-dimensional memory cell 100.

The number of non-volatile memory control circuits is arranged to be greater than or equal to the sum of the number of communication protocol circuits 122 and the number of logic circuits 124, such that when the data is stored, it may be possible to ensure that the data in communication protocol circuit 122 and the data in the plurality of different logic circuits 124 may be programed in the non-volatile memory chip 130 in time through the non-volatile memory control circuit. In this way, it may reduce data accumulation in the communication protocol circuit 122 or the logic circuit 124, thereby improving the usage reliability of the non-volatile three-dimensional memory cell 100.

Similarly, when the data is read, the non-volatile memory control circuit may timely transmit data to the communication protocol circuit 122 or the a plurality of different logic circuits 124, so as to reduce a case where the data in the communication protocol circuit 122 or the logic circuit 124 is too little, which may cause the communication protocol circuit 122 or the logic circuit 124 to be idle and affect the efficiency of processing data of the non-volatile three-dimensional memory cell 100, thereby further ensuring the usage reliability of the non-volatile three-dimensional memory cell 100.

In some embodiments, the number of memory control circuits is equal to the sum of the number of communication protocol circuits 122 and the number of logic circuits 124. The number of non-volatile memory control circuits is also equal to the sum of the number of communication protocol circuits 122 and the number of logic circuits 124.

In some embodiments, the communication protocol includes at least one of a Compute Express Link (CXL) protocol, a CCIX protocol, a Generation Z (GEN Z) protocol, an Open Computer Assisted Personal Interviewing (OpenCPAI) protocol, and a Bus Communication (Nvlink) Protocol.

The communication protocol includes at least one of the CXL protocol, the CCIX protocol, the GEN Z protocol, OpenCPAI protocol, and the NVlink protocol. Thus, the data programed in the volatile memory chip 110 and the non-volatile memory chip 130 may be processed according to different communication protocols, and the data read from the volatile memory chip 110 and the non-volatile memory chip 130 may also be processed, such that it may meet the transmission needs of different data and improve the applicability of the non-volatile three-dimensional memory cell 100. At the same time, by arranging the above communication protocol, the data transmission speed may be further improved, thereby improving the efficiency of processing data of the non-volatile three-dimensional memory cell 100.

In some embodiments, the communication protocol may further include other communication protocols that may be capable of achieving a consistent high-speed serial interface.

In some embodiments, the number of volatile memory chips 110 is at least two, and the at least two volatile memory chips 110 are connected to each other in the three-dimensional stacked manner through the three-dimensional heterogeneous integrated structure 140.

It may be understood that the number of volatile memory chip 110 is arranged to be at least two, such that it may increase the storage capacity of the non-volatile three-dimensional memory cell 100, further improve the performance of the non-volatile three-dimensional memory cell 100, and meet different storage needs.

In addition, the at least two volatile memory chips 110 are connected to each other in the three-dimensional stacked manner through the three-dimensional heterogeneous integrated structure 140, such that it may increase the data processing bandwidth of the non-volatile three-dimensional memory cell 100, improve the efficiency of data transmission between the at least two volatile memory chips 110, reduce the power consumption of the non-volatile three-dimensional memory cell 100, and improve the performance of the non-volatile three-dimensional memory cell 100.

In some embodiments, the number of interface chips 120 is at least two, and the at least two interface chips are connected to each other in the three-dimensional stacked manner through the three-dimensional heterogeneous integrated structure 140. Alternatively, the at least two interface chips 120 are connected to the volatile memory chip 110 in the three-dimensional stacked manner through the three-dimensional heterogeneous integrated structure 140, respectively.

The number of interface chips 120 is at least two, such that it may increase the number of communication protocol circuits 122 and the number of logic circuits 124, thereby further improving the efficiency of processing data of the non-volatile three-dimensional memory cell 100. At the same time, the at least two interface chips 120 are connected to each other in the three-dimensional stacked manner through the three-dimensional heterogeneous integrated structure 140, such that it may increase a data transmission bandwidth between the at least two interface chips 120, improve the efficiency of data transmission of the non-volatile three-dimensional memory cell 100, reduce the power consumption of the non-volatile three-dimensional memory cell 100, and improve the performance of the non-volatile three-dimensional memory cell 100.

Alternatively, the at least two interface chips 120 are connected to the volatile memory chip 110 in the three-dimensional stacked manner through the three-dimensional heterogeneous integrated structure 140, such that the data may be received by different interface chips 120, respectively, and the processed data is programed in the volatile memory chip 110. Similarly, the data stored in the volatile memory chip 110 may also be read through different interface chips 120, thereby improving the usage flexibility of the non-volatile three-dimensional memory cell 100.

In some embodiments, the number of non-volatile memory chips 130 is at least two, and the at least two non-volatile memory chips 130 are connected to each other in the three-dimensional stacked manner through the three-dimensional heterogeneous integrated structure 140. Alternatively, as shown in FIG. 8, the at least two non-volatile memory chips 130 are connected to the volatile memory chip 110 and interface chip 120 in the three-dimensional stacked manner through the three-dimensional heterogeneous integrated structure 140, respectively.

It may be understood that the number of non-volatile memory chips 130 is arranged to be at least two, such that it may increase the storage capacity of the non-volatile three-dimensional memory cell 100 and improve the storage reliability of the data.

In addition, the at least two volatile memory chips 110 are connected to each other in the three-dimensional stacked manner through the three-dimensional heterogeneous integrated structure 140, such that it may increase the data processing bandwidth of the non-volatile three-dimensional memory cell 100, improve the efficiency of data transmission between the at least two volatile memory chips 110, reduce the power consumption of the non-volatile three-dimensional memory cell 100, and improve the usage performance of the non-volatile three-dimensional memory cell 100.

Alternatively, as shown in FIG. 8, the at least two non-volatile memory chip 130 are connected to the volatile memory chip 110 and the interface chip 120 in the three-dimensional stacked manner through the three-dimensional heterogeneous integrated structure 140, respectively, such that the data may be transmitted not only between the non-volatile memory chip 130 and the volatile memory chip 110, but also between the non-volatile memory chip 130 and the interface chip 120, thereby meeting different usage requirements and further enhancing the applicability of the non-volatile three-dimensional memory cell 100.

In some embodiments, the orthographic projection of the volatile memory chip 110, the orthographic projection of the interface chip 120, and the orthographic projection of the non-volatile memory chip 130 may be completely coincided with each other.

It may be understood that the orthographic projection of the volatile memory chip 110, the orthographic projection of the interface chip 120, and the orthographic projection of the non-volatile memory chip 130 may be completely coincided with each other, that is, the disposing position of the volatile memory chip 110, the disposing position of the interface chip 120, and the disposing position of the non-volatile memory chip 130 correspond to each other. In addition, an area of the volatile memory chip 110, an area of the interface chip 120, and an area of the non-volatile memory chip 130 are the same or approximately the same as each other. In this way, it may further shorten the data transmission path between the volatile memory chip 110, the interface chip 120, and the non-volatile memory chip 130, thereby improving the reliability of data transmission between the volatile memory chip 110, the interface chip 120, and the non-volatile memory chip 130. Moreover, through the above arrangement, the structural regularity of the non-volatile three-dimensional memory cell 100 may be improved, which facilitates processing, and the production efficiency of the non-volatile three-dimensional memory cell 100 may be improved.

In some embodiments, the non-volatile three-dimensional memory cell 100 further includes a capacitor. The capacitor is electrically connected to the non-volatile memory chip 130 and configured to supply power to the non-volatile memory chip 130.

It may be understood that, when the non-volatile three-dimensional memory cell 100 is powered on, the capacitor may store a certain amount of electrical energy. When the non-volatile three-dimensional memory cell 100 is powered off, the capacitor may be discharged. Since the capacitor is electrically connected to the non-volatile memory chip 130, the capacitor may supply power to the non-volatile memory chip 130 when the non-volatile three-dimensional memory cell 100 is powered off, such that the data from the volatile memory chip 110 or the data from the interface chip 120 may be programed in the non-volatile memory chip 130, thereby reducing data loss due to power failure and improving the reliability of data storage. In this way, the usage reliability of the non-volatile three-dimensional memory cell 100 may be improved.

In some embodiments, the capacitor may be a plate capacitor, thereby reducing volume of the non-volatile three-dimensional memory cell 100 and improving the usage flexibility of the non-volatile three-dimensional memory cell 100.

In a second aspect, the embodiments of the present disclosure provide a method for storing data. The method is applied in the non-volatile three-dimensional memory cell 100 as described in the first aspect. A volatile memory chip 110 includes a first memory array 112 and a second memory array 114. A non-volatile memory chip 130 includes a third memory array 116 and a fourth memory array 118. An interface chip 120 further includes a plurality of logic circuits 124 electrically connected to each other through a routing unit 134, and each of the plurality of logic circuits 124 is electrically connected to the communication protocol circuit 122 through the routing unit 134.

In some embodiments, as shown in FIG. 9, the data storage method includes a following operation.

At block S102, data from a communication protocol circuit is received, and the data from the communication protocol circuit is stored in at least one of the first memory array and the third memory array.

Figures 10, 11:
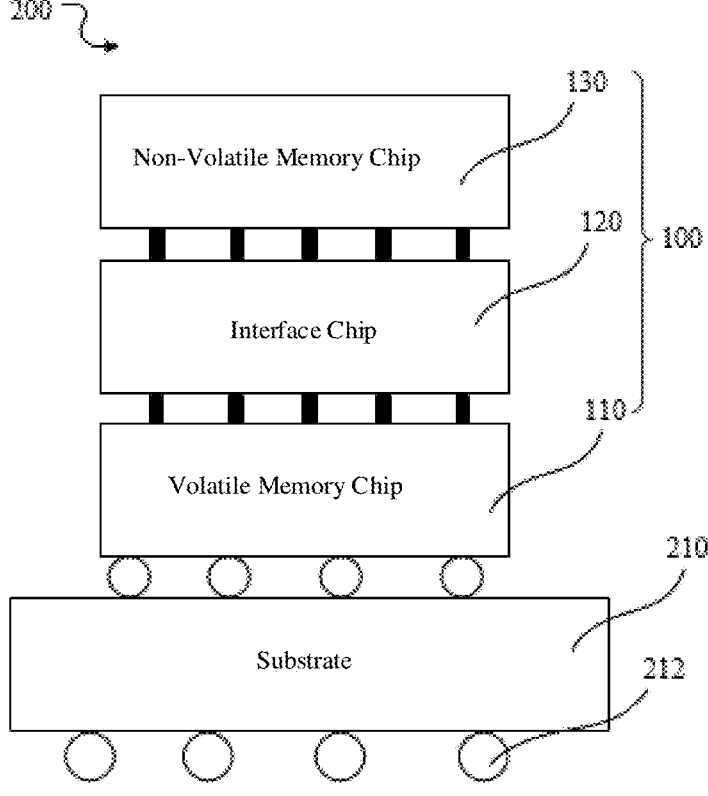
FIG. 10 is a flow chart of a method for storing data according to some embodiments of the present disclosure.
FIG. 11 is a structural schematic view of a three-dimensional non-volatile memory chip assembly according to some embodiments of the present disclosure.

Alternatively, as shown in FIG. 10, the data storage method includes a following operation.

At block S202, data from the communication protocol circuit is received, the data from the communication protocol is transmitted to at least one of the logic circuits through the routing unit, and the data processed by the at least one of the logic circuits is stored in at least one of the second memory array and the fourth memory array.

The method for storing data provided by the embodiments of the present disclosure is applied in the non-volatile three-dimensional memory cell 100 as described in the first aspect, which has all the technical effects of the first aspect above and will not be repeated here.

In some embodiments, the method for storing data includes: receiving data from the communication protocol circuit, directly storing the data from the communication protocol circuit in at least one of the first memory array and the third memory array, and the data processed by the communication protocol circuit may be processed without the logic circuit and directly programed in at least one of the volatile memory chip and the non-volatile memory chip for being stored.

Alternatively, the data storage method includes: receiving data from the communication protocol circuit, transmitting the data to at least one of the logic circuits through the routing unit, and storing the data processed by at least one of the logic circuits in at least one of the second memory array and the fourth memory array. That is, after the data processed by the communication protocol circuit may be processed by one or more different logic circuits, the data may be programed in at least one of the volatile memory chip and the non-volatile memory chip for being stored.

By using two different methods for storing data as mentioned above, it may meet the storage needs of different data and improve the applicability of the method for storing data.

In a third aspect, as shown in FIG. 11, the embodiments of the present disclosure provide a non-volatile three-dimensional memory chip assembly 200. The non-volatile three-dimensional memory chip assembly 200 includes the non-volatile three-dimensional memory cell 100 as described in the first aspect mentioned above and a substrate 210. The substrate 210 is electrically connected to the non-volatile three-dimensional memory cell 100. The substrate 210 is configured to encapsulate the non-volatile three-dimensional memory cell 100.

The non-volatile three-dimensional memory chip assembly 200 provided by the embodiments of the present disclosure includes the non-volatile three-dimensional memory cell 100 as described in the first aspect above, which has all the technical effects of the first aspect above and will not be repeated here.

In some embodiments, the substrate 210 includes a pin 212, and the non-volatile three-dimensional memory cell 100 is electrically connected to other components through the pin 212.

In some embodiments, when a plurality of volatile memory chips 110 are connected to a plurality of interface chips 120 in the three-dimensional stacked manner, each of the plurality of interface chips 120 may be electrically connected to the pin 212 by means of a Through Silicon Via (TSV) technology, such that the data may be transmitted between the each of the plurality of interface chips 120 and the pin 212.

Figure 12:
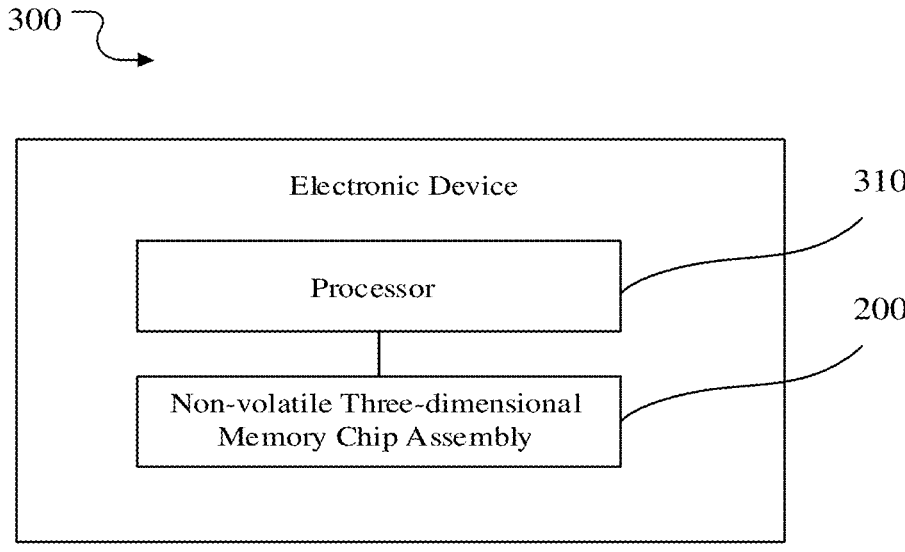
FIG. 12 is a structural schematic view of an electronic device according to some embodiments of the present disclosure.

In a fourth aspect, as shown in FIG. 12, the embodiments of the present disclosure provide an electronic device 300. The electronic device 300 includes a processor 310 and the non-volatile three-dimensional memory chip assembly 200 as described in the third aspect. The non-volatile three-dimensional memory chip assembly 200 is electrically connected to the processor 310.

The electronic device 300 provided by the embodiments of the present disclosure includes the non-volatile three-dimensional memory chip assembly 200 as described in the third aspect, which has all the technical effects of the third aspect and will not be repeated here.

In some embodiments, the electronic device 300 may be a device such as a mobile phone, a computer, a smart home appliance, etc.

In an embodiment, a non-volatile three-dimensional memory cell 100 is provided by the embodiments of the present disclosure. In some embodiments, the non-volatile three-dimensional memory cell 100 may perform data transmission between the non-volatile three-dimensional memory cell 100 and a host.

In some embodiments, as shown in FIG. 1, the non-volatile three-dimensional memory cell 100 includes a volatile memory chip 110, an interface chip 120, and a non-volatile memory chip 130. The volatile memory chip 110 and the interface chip 120 form a three-dimensional heterogeneous integrated structure 140 by means of hybrid bonding, such that the volatile memory chip 110 is connected to the interface chip 120 in the three-dimensional stacked manner, and the data may be transmitted between the volatile memory chip 110 and the interface chip 120. The non-volatile memory chip 130 and the interface chip 120 also form the three-dimensional heterogeneous integrated structure 140 by means of hybrid bonding, such that the non-volatile memory chip 130 is connected to the interface chip 120 in the three-dimensional stacked manner, and the data may be transmitted between the non-volatile memory chip 130 and the interface chip 120.

In some embodiments, the volatile memory chip 110 is a Dynamic Random Access Memory (DRAM) chip. The non-volatile memory chip 130 may be a Programmable Read Only Memory (PROM), an Electrically Erasable Programmable Read Only Memory (EEPROM), an Erasable Programmable Read Only Memory (EPROM), and so on.

In some embodiments, the volatile memory chip 110 may be connected to the interface chip 120 in the three-dimensional stacked manner through a three-dimensional chip (3D-IC) technology. Similarly, the non-volatile memory chip 130 may also be connected to the interface chip 120 in the three-dimensional stacked manner through a three-dimensional chip (3D-IC) technology.

It may be understood that the volatile memory chip 110 may be connected to the interface chip 120 in the three-dimensional stacked manner through the three-dimensional heterogeneous integrated structure 140, and the non-volatile memory chip 130 may also be connected to the interface chip 120 in the three-dimensional stacked manner through the three-dimensional heterogeneous integrated structure 140, such that the data may be transmitted between the volatile memory chip 110, the interface chip 120, and the non-volatile memory chip 130 through the three-dimensional heterogeneous integrated structure 140. In this way, it may be possible to greatly increase the data processing bandwidth of the non-volatile three-dimensional memory cell 100, shorten the data transmission path of the non-volatile three-dimensional memory cell 100, reduce the power consumption of the non-volatile three-dimensional memory cell 100, reduce the latency of the data storage and reading process, and improve the efficiency of storing and reading the data. In addition, it may also be possible to reduce the area of the non-volatile three-dimensional memory cell 100 and improve the usage flexibility of the non-volatile three-dimensional memory cell 100.

In some embodiments, through the above arrangement, the data processing bandwidth of the non-volatile three-dimensional memory cell 100 may reach in a range from 32 GB/S to 128 GB/S.

In some embodiments, the interface chip 120, the volatile memory chip 110, and the non-volatile memory chip 130 may be connected to each other in the three-dimensional stacked manner by means of a wafer on wafer (WoW) connection way or a chip on wafer (CoW) connection way.

In some embodiments, the non-volatile three-dimensional memory cell 100 further includes a capacitor. The capacitor is electrically connected to the non-volatile memory chip 130 and configured to supply power to the non-volatile memory chip 130, such that the data may be programed in the non-volatile memory chip 130 for being stored in case of power failure, thereby improving storage reliability of the data.

As shown in FIG. 2, the interface chip 120 includes a communication protocol circuit 122 and a plurality of logic circuits 124. It may be understood that, the communication protocol circuit 122 is configured to store the communication protocol, and the plurality of logic circuits 124 are configured to store different calculation logic. As shown in FIG. 7, the plurality of logic circuits 124 are arranged around the communication protocol circuit 122. The interface chip 120 is further arranged with a routing unit 134. Each of the plurality of logic circuits 124 is electrically connected to the communication protocol circuit 122 through the routing unit 134, and the plurality of logic circuits 124 are electrically connected to each other through the routing unit 134. In some embodiments, the routing unit 134 is a network on chip (NOC) routing unit, and the data may be transmitted on the routing unit 134.

As shown in FIG. 3, the volatile memory chip 110 includes a first memory array 112 and a second memory array 114. The communication protocol circuit 122 is electrically connected to the first memory array 112 through a first three-dimensional heterogeneous integration structure 142, and the logic circuit 124 is electrically connected to the second memory array 114 through a second three-dimensional heterogeneous integration structure 144.

As shown in FIG. 4, the non-volatile memory chip 130 includes a third memory array 116 and a fourth memory array 118. The communication protocol circuit 122 is electrically connected to the third memory array 116 through a third three-dimensional heterogeneous integration structure 146, and the logic circuit 124 is electrically connected to the fourth memory array 118 through a fourth three-dimensional heterogeneous integration structure 148.

In some embodiments, when the data is stored, after data in the interface chip 120 is processed by the communication protocol circuit 122, the data may be stored in the first memory array 112 through the first three-dimensional heterojunction structure 142, and the data may be stored in the third memory array 116 through the third three-dimensional heterojunction structure 146.

Alternatively, when the data is stored, after the data in the interface chip 120 is processed by the communication protocol circuit 122, the data may be transmitted to at least one of the plurality of logic circuits 124 through the routing unit 134. After the data is processed by the at least one of the plurality of logic circuits 124, the data may be stored in the second memory array 114 through the second three-dimensional heterogeneous integration structure 144, and the data may also be stored in the fourth memory array 118 through the fourth three-dimensional heterogeneous integrated structure 148.

Similarly, when the data is read, the data in the volatile memory chip 110 may be transmitted to the communication protocol circuit 122 through the first three-dimensional heterogeneous integrated structure 142, and the data may be transmitted outwards after the data is processed by the communication protocol circuit 122. The data in the non-volatile memory chip 130 may be transmitted to the communication protocol circuit 122 through the third three-dimensional heterogeneous integrated structure 146, and the data may be transmitted outwards after the data is processed by the communication protocol circuit 122.

Alternatively, when the data is read, the data in the volatile memory chip 110 may be transmitted to one of the plurality of logic circuits 124 through the second three-dimensional heterogeneous integrated structure 144, and the one of the plurality of logic circuits 124 transmits the processed data to another of the plurality of logic circuits 124 or the communication protocol circuit 122 through the routing unit 134. The data in the non-volatile memory chip 130 may be transmitted to one of the plurality of logic circuits 124 through the fourth three-dimensional heterogeneous integrated structure 148, and the one of the plurality of logic circuits 124 transmits the processed data to another of the plurality of logic circuits 124 or the communication protocol circuit 122 through the routing unit 134. The communication protocol circuit 122 receives the data processed by at least one of the plurality of logic circuits 124 and transmits the data to the outside.

It may be seen that through the above arrangement, the data may be programed in the volatile memory chip 110 and the non-volatile memory chip 130 in a cache coherence manner, and the data may be read from the volatile memory chip 110 and the non-volatile memory chip 130 in the cache coherence manner. That is, it may be possible to achieve data storage and reading, as well as the logical calculation of data in a case where it is not necessary to transmit the data to the main board, a programmable controller, or other components, thereby shortening the data transmission path and improving the efficiency of storing and reading the data.

In addition, the plurality of logic circuits 124 are electrically connected to each other through the routing unit 134, and the plurality of logic circuits 124 are electrically connected to the communication protocol circuit 122 through the routing unit 134, respectively, such that the data may be directly stored or read, and the data may also be stored or read after the data is processed by the logic circuit 124, thereby meeting the processing requirements of different data, and improving the usage flexibility of the non-volatile three-dimensional memory cell 100.

In addition, through the above arrangement, mutual crosstalk between data stored in different memory chips (namely, between data stored in the volatile memory chip 110 and data stored in the non-volatile memory chip 130) may be reduced, thereby improving the usage reliability of the non-volatile three-dimensional memory cell 100. Moreover, it may also reduce the crosstalk generated when the data with different processing requirements (namely, data that requires logical calculation and data that does not require logical calculation) is stored and read, thereby further improving the usage reliability of the non-volatile three-dimensional memory cell 100.

In some embodiments, as shown in FIG. 3, the disposing position of the volatile memory chip 110, the disposing position of the interface chip 120, and the disposing position of the non-volatile memory chip 130 correspond to each other, and the area of the volatile memory chip 110, the area of the interface chip 120, and the area of the non-volatile memory chip 130 are approximately equal to each other, thereby further shortening the data transmission path and improving the reliability of data transmission therebetween. In this way, the usage reliability of the non-volatile three-dimensional memory cell 100 may be improved. In addition, the structural regularity of the non-volatile three-dimensional memory cell 100 may be improved, which facilitates processing, thereby improving the production efficiency of the non-volatile three-dimensional memory cell 100.

Moreover, the disposing position of the communication protocol circuit 122 corresponds to the disposing position of the first memory array 112 and the disposing position of the third memory array 116, and the disposing position of the logic circuit 124 corresponds to the disposing position of the second memory array 114 and the disposing position of the fourth memory array 118. In this way, the distance between the communication protocol circuit 122 and the first memory array 112 may be further shortened, the distance between the communication protocol circuit 122 and the third memory array 116 may be further shortened, the distance between the logic circuit 124 and the second memory array 114 may be further shortened, and the distance between the logic circuit 124 and the fourth memory array 118 may be further shortened.

The routing unit 134 is arranged between the communication protocol circuit 122 and the logic circuit 124, such that the disposing position of the routing unit 134 may correspond to the disposing position of the volatile memory chip 110 and the position of the non-volatile memory chip 130. In this way, the distance between the communication protocol circuit 122 and the logic circuit 124 may be further shortened. Through the above arrangement, the data transmission path may be shortened and the efficiency of processing data of the non-volatile three-dimensional memory cell 100 may be improved.

The communication protocol circuit 122 stores at least one of a Compute Express Link (CXL) protocol, a CCIX protocol, a Generation Z (GEN Z) protocol, an Open Computer Assisted Personal Interviewing (OpenCPAI) protocol, and a Bus Communication (Nvlink) Protocol. In this way, the data may be processed through different communication protocols, thereby improving the applicability of the non-volatile three-dimensional memory cell 100.

In some embodiments, the communication protocol circuit 122 may further include other high-speed serial interface protocols that may achieve cache coherence, thereby further improving the data processing bandwidth of the non-volatile three-dimensional memory cell 100.

As shown in FIG. 5, the logic circuit 124 includes a fixed logic circuit 126 and a programmable logic circuit 128. The fixed logic circuit 126 is configured to store fixed computational logic. The programmable logic circuit 128 is configured to store programmable computational logic. In some embodiments, the programmable logic circuit 128 may be an Embedded Field Programmable Gate Array (EFPGA).

As shown in FIG. 6, the programmable logic circuit 128 includes an embedded programmable logic circuit 131, an embedded multiplication circuit 132, and an embedded memory cell 133. The embedded programmable logic circuit 131 is electrically connected to the volatile memory chip 110 and the non-volatile memory chip 130 through a three-dimensional chip (3D-IC) technology, such that the data transmission may be performed between the programmable logic circuit 128 and the volatile memory chip 110, and between the programmable logic circuit 128 and the non-volatile memory chip 130, thereby improving the data transmission bandwidth. The embedded memory cell 133 may be electrically connected to the embedded programmable logic circuit 131 through routing, etc. The embedded multiplication circuit 132 may be electrically connected to the embedded programmable logic circuit 131 through an interface, etc.

By arranging the embedded programmable logic circuit 131, the embedded multiplication circuit 132, and the embedded memory cell 133, the computational logic of the programmable logic circuit 128 may be modified, thereby improving the applicability of the non-volatile three-dimensional memory cell 100.

The non-volatile three-dimensional memory cell 100 further includes a memory control circuit and a non-volatile memory control circuit. It may be understood that, the memory control circuit and the non-volatile memory control circuit may be memory controllers (MCs). The memory control circuit may be arranged on the interface chip 120 or the volatile memory chip 110, and the number of memory control circuits is equal to the sum of the number of communication protocol circuits 122 and the number of logic circuits 124. In this way, data may be programed in the volatile memory chip 110 in time and may be read from the volatile memory chip 110 in time, thereby improving the usage reliability of the non-volatile three-dimensional memory cell 100.

The non-volatile memory control circuit may be arranged on the interface chip 120 or the non-volatile memory chip 130, and the number of non-volatile memory control circuits is equal to the sum of the number of communication protocol circuits 122 and the number of logic circuits 124. In this way, data may be programed in the non-volatile memory chip 130 in time and read from the non-volatile memory chip 130 in time, thereby further improving the usage reliability of the non-volatile three-dimensional memory cell 100.

Terms "first", "second", and "third" in the present disclosure are used for descriptive purposes only and shall not be interpreted as indicating or implying relative importance. The term "plurality" means at least two, unless otherwise expressly and specifically limited. Terms "mounted", "connected", "coupled", "fixed" and the like are understood in a broad sense. For example, "fixed" may be a fixed connection, a detachable connection, or an integral connection; "coupled" may also be a direct connection or an indirect connection through an intermediate medium. For those ordinary skilled in the art, the specific meanings of the aforementioned terms in the present application can be understood according to practical conditions In the description of the present disclosure, it should be understood that terms such as "upper", "lower", "front", "rear", "left", "right", etc., refer to the orientations and locational relations illustrated in the drawings, and for describing the present disclosure and for describing in a simple manner, and which are not intended to indicate or imply that the device or the elements are disposed to locate at the specific directions or are structured and performed in the specific directions, which could not to be understood as limiting the present disclosure.

In the description of the specification, descriptions with reference to terms "an embodiment", "some embodiments", or "specific examples", "some examples", etc., means that the specific features, structures, materials, or characteristics described in connection with the embodiment or example are included in at least one embodiment or example of the present disclosure. In the specification, the schematic representation of the above terms does not necessarily refer to the same embodiment or example. Further, the specific features, structures, materials, or characteristics described may be combined in any one or more embodiments or examples in a suitable manner.

The above is only preferred embodiments of the present disclosure, and is not intended to limit the present disclosure. For those skilled in the art, the present disclosure may have various changes and variations. Any modification, equivalent replacement, improvement, etc. made within the spirit and principle of this application shall be included in the scope of protection of this application.

25

What is claimed is:

1. A non-volatile three-dimensional memory cell, comprising:

a volatile memory chip, configured to store data;

an interface chip, connected to the volatile memory chip in a three-dimensional stacked manner through a three-dimensional heterogeneous integrated structure;

a non-volatile memory chip, connected to at least one of the volatile memory chip and the interface chip in a three-dimensional stacked manner through the three-dimensional heterogeneous integrated structure, so as to form the non-volatile three-dimensional memory cell;

wherein the interface chip comprises a communication protocol circuit configured to store a communication protocol, the data is programed in at least one of the volatile memory chip and the non-volatile memory chip in a cache coherence manner through the communication protocol circuit; and, the data is read from at least one of the volatile memory chip and the non-volatile memory chip in a cache coherence manner through the communication protocol circuit;

wherein the volatile memory chip comprises a first memory array, a second memory array, a third memory array, and a fourth memory array the interface chip further comprises a plurality of logic circuits electrically connected to each other through a routing unit, and each of the plurality of logic circuits is electrically connected to the communication protocol circuit through the routing unit.

2. The non-volatile three-dimensional memory cell according to claim 1, wherein the interface chip further comprises:

one or more logic circuits, electrically connected to the communication protocol circuit;

the data is programed in at least one of the volatile memory chip and the non-volatile memory chip in the cache coherence manner through the communication protocol circuit and the logic circuit, and, the data is read from at least one of the volatile memory chip and the non-volatile memory chip in the cache coherence manner through the communication protocol circuit and the logic circuit.

3. The non-volatile three-dimensional memory cell according to claim 2, wherein the volatile memory chip comprises a first memory array and a second memory array, the communication protocol circuit is electrically connected to the first memory array through a first three-dimensional heterogeneous integrated structure, and the logic circuit is electrically connected to the second memory array through a second three-dimensional heterogeneous integrated structure;

an orthographic projection of the communication protocol circuit falls within a range of an orthographic projection of the first memory array, and an orthographic projection of the logic circuit falls within a range of an orthographic projection of the second memory array.

4. The non-volatile three-dimensional memory cell according to claim 2, wherein the non-volatile memory chip is connected to the interface chip in a three-dimensional stacked manner through the three-dimensional heterogeneous integrated structure;

the non-volatile memory chip comprises a third memory array and a fourth memory array, the communication protocol circuit is electrically connected to the third memory array through a third three-dimensional heterojunction integrated structure, and the logic circuit is electrically connected to the fourth memory array through a fourth three-dimensional heterojunction integrated structure;

an orthographic projection of the communication protocol circuit falls within a range of an orthographic projection of the third memory array, and an orthographic projection of the logic circuit falls within a range of an orthographic projection of the fourth memory array.

5. The non-volatile three-dimensional memory cell according to claim 2, wherein the logic circuit comprises at least one of a fixed logic circuit and a programmable logic circuit.

6. The non-volatile three-dimensional memory cell according to claim 2, wherein the number of the logic circuits is more than one, and a plurality of logic circuits are arranged around the communication protocol circuit.

7. The non-volatile three-dimensional memory cell according to claim 6, wherein the interface chip further comprises a routing unit;

wherein an orthographic projection of the routing unit falls within a range of an orthographic projection of the volatile memory chip; and the plurality of logic circuits are electrically connected to each other through the routing unit, and each of the plurality of logic circuits is electrically connected to the communication protocol circuit through the routing unit.

8. The non-volatile three-dimensional memory cell according to claim 2, further comprising:

a memory control circuit, arranged on at least one of the volatile memory chip and the interface chip; and a non-volatile memory control circuit, arranged on at least one of the non-volatile memory chip and the interface chip.

9. The non-volatile three-dimensional memory cell according to claim 8, wherein the number of memory control circuits is greater than or equal to a sum of the number of communication protocol circuits and the number of the logic circuits;

the number of non-volatile memory control circuits is greater than or equal to a sum of the number of the communication protocol circuits and the number of the logic circuits.

10. The non-volatile three-dimensional memory cell according to claim 1, wherein the communication protocol comprises at least one of Compute Express Link (CXL) protocol, a CCIX protocol, a Generation Z (GEN Z) protocol, an Open Computer Assisted Personal Interviewing (OpenCPAI) protocol, and a Nvlink protocol.

11. The non-volatile three-dimensional memory cell according to claim 1, wherein the number of volatile memory chips is at least two, and the at least two of volatile memory chips are connected to each other in a three-dimensional stacked manner through a three-dimensional heterogeneous integrated structure.

12. The non-volatile three-dimensional memory cell according to claim 1, wherein the number of interface chips is at least two, and the at least two of interface chips are connected to each other in a three-dimensional stacked manner through a three-dimensional heterogeneous integrated structure; or each of the at least two of the interface chips is connected to the volatile memory chip in the three-dimensional stacked manner through the three-dimensional heterogeneous integrated structure.

13. The non-volatile three-dimensional memory cell according to claim 1, wherein the number of non-volatile memory chips is at least two, and the at least two non-volatile memory chips are connected to each other in a three-dimensional stacked manner through a three-dimensional heterogeneous integrated structure; or each of the at least two non-volatile memory chips is connected to the volatile memory chip and the interface chip in the three-dimensional stacked manner through the three-dimensional heterogeneous integrated structure.

14. The non-volatile three-dimensional memory cell according to claim 1, wherein an orthographic projection of the volatile memory chip, an orthographic projection of the interface chip, and an orthographic projection of the non-volatile memory chip are completely coincided with each other.

15. The non-volatile three-dimensional memory cell according to claim 1, further comprising:

a capacitor, electrically connected to the non-volatile memory chip and configured to supply power to the non-volatile memory chip.

16. A method for storing data, applied in a non-volatile three-dimensional memory cell;

wherein the non-volatile three-dimensional memory cell comprises:

a volatile memory chip, configured to store data;

an interface chip, connected to the volatile memory chip in a three-dimensional stacked manner through a three-dimensional heterogeneous integrated structure;

a non-volatile memory chip, connected to at least one of the volatile memory chip and the interface chip in a three-dimensional stacked manner through the three-dimensional heterogeneous integrated structure, so as to form the non-volatile three-dimensional memory cell;

wherein the interface chip comprises a communication protocol circuit configured to store a communication protocol, the data is programed in at least one of the volatile memory chip and the non-volatile memory chip in a cache coherence manner through the communication protocol circuit; and, the data is read from at least one of the volatile memory chip and the non-volatile memory chip in a cache coherence manner through the communication protocol circuit;

wherein the volatile memory chip comprises a first memory array, a second memory array, a third memory array, and a fourth memory array the interface chip further comprises a plurality of logic circuits electrically connected to each other through a routing unit, and each of the plurality of logic circuits is electrically connected to the communication protocol circuit through the routing unit;

wherein the method comprises:

receiving the data from the communication protocol circuit, and storing the data from the communication protocol circuit in at least one of the first memory array and the third memory array; or receiving the data from the communication protocol circuit, and transmitting the data from the communication protocol circuit to at least one of the plurality of logic circuits through the routing unit, and storing data processed by the at least one of the logic circuits in at least one of the second memory array and the fourth memory array.

17. The method according to claim 16, wherein the interface chip further comprises:

one or more logic circuits, electrically connected to the communication protocol circuit;

the data is programed in at least one of the volatile memory chip and the non-volatile memory chip in the cache coherence manner through the communication protocol circuit and the logic circuit, and, the data is read from at least one of the volatile memory chip and the non-volatile memory chip in the cache coherence manner through the communication protocol circuit and the logic circuit.

18. The method according to claim 17, wherein the number of the logic circuits is more than one, and a plurality of logic circuits are arranged around the communication protocol circuit.

19. The method according to claim 16, wherein an orthographic projection of the volatile memory chip, an orthographic projection of the interface chip, and an orthographic projection of the non-volatile memory chip are completely coincided with each other.

20. A non-volatile three-dimensional memory chip assembly, comprising:

a non-volatile three-dimensional memory cell;

wherein the non-volatile three-dimensional memory cell comprises:

a volatile memory chip, configured to store data;

an interface chip, connected to the volatile memory chip in a three-dimensional stacked manner through a three-dimensional heterogeneous integrated structure;

a non-volatile memory chip, connected to at least one of the volatile memory chip and the interface chip in a three-dimensional stacked manner through the three-dimensional heterogeneous integrated structure, so as to form the non-volatile three-dimensional memory cell;

wherein the interface chip comprises a communication protocol circuit configured to store a communication protocol, the data is programed in at least one of the volatile memory chip and the non-volatile memory chip in a cache coherence manner through the communication protocol circuit; and, the data is read from at least one of the volatile memory chip and the non-volatile memory chip in a cache coherence manner through the communication protocol circuit;

a substrate, electrically connected to the non-volatile three-dimensional memory cell and configured to encapsulate the non-volatile three-dimensional memory cell;

wherein the volatile memory chip comprises a first memory array, a second memory array, a third memory array, and a fourth memory array the interface chip further comprises a plurality of logic circuits electrically connected to each other through a routing unit, and each of the plurality of logic circuits is electrically connected to the communication protocol circuit through the routing unit.

* * * * *